(12) United States Patent
Shinohara

(10) Patent No.: US 9,893,103 B2
(45) Date of Patent: Feb. 13, 2018

(54) SOLID-STATE IMAGE SENSOR

(71) Applicant: CANON KABUSHIKI KAISHA, Tokyo (JP)

(72) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 298 days.

(21) Appl. No.: 14/733,575

(22) Filed: Jun. 8, 2015

(65) Prior Publication Data

US 2015/0364512 A1 Dec. 17, 2015

(30) Foreign Application Priority Data

Jun. 17, 2014 (JP) ................................ 2014-124463

(51) Int. Cl.
*H01L 27/00* (2006.01)
*H01L 27/146* (2006.01)
*H04N 5/363* (2011.01)
*H04N 5/374* (2011.01)

(52) U.S. Cl.
CPC .. *H01L 27/14612* (2013.01); *H01L 27/14679* (2013.01); *H04N 5/363* (2013.01); *H04N 5/374* (2013.01)

(58) Field of Classification Search
CPC ......... H01L 27/14612; H01L 27/14605; H01L 27/14679; H04N 5/363; H04N 5/374; H04N 5/378

USPC ....................................................... 250/208.1
See application file for complete search history.

(56) References Cited

U.S. PATENT DOCUMENTS

| 4,065,668 | A | * | 12/1977 | Monticelli | ................ | G01J 1/44 |
| | | | | | | 250/214 P |
| 4,324,462 | A | * | 4/1982 | Tano | ...................... | G03B 7/093 |
| | | | | | | 396/229 |
| 5,521,555 | A | * | 5/1996 | Tazartes | .................... | G01J 1/44 |
| | | | | | | 250/214 A |
| 6,188,093 | B1 | * | 2/2001 | Isogai | ............... | H01L 27/14609 |
| | | | | | | 257/223 |

FOREIGN PATENT DOCUMENTS

JP          2004-63650 A      2/2004

* cited by examiner

*Primary Examiner* — Georgia Y Epps
*Assistant Examiner* — Kevin Wyatt
(74) *Attorney, Agent, or Firm* — Canon USA, Inc. I.P. Division

(57) ABSTRACT

At least one solid-state image sensor includes a first photoelectric conversion unit configured to convert light into an electric charge, a first field effect transistor including a gate to which the electric charge converted by the first photoelectric conversion unit is input, and a bipolar transistor including a base and an emitter, the base being connected to a source of the first field effect transistor, and the emitter being configured to output a signal.

17 Claims, 2 Drawing Sheets

SOLID-STATE IMAGE SENSOR

BACKGROUND OF THE INVENTION

Field of the Invention

The present inventions relate to at least one solid-state image sensor, and method(s) of making or using the at least one solid-state image sensor.

Description of the Related Art

Japanese Patent Laid-Open No. 2004-63650 discloses a solid-state image sensor configured to read out a pixel signal via a source follower amplifier using a junction field effect transistor (JFET).

SUMMARY OF THE INVENTION

In accordance with at least one aspect of the present inventions, at least one solid-state image sensor includes a first photoelectric conversion unit configured to convert light into an electric charge, a first field effect transistor including a gate to which the electric charge converted by the first photoelectric conversion unit is input, and a bipolar transistor including a base and an emitter, the base being connected to a source of the first field effect transistor, and the emitter being configured to output a signal.

According to other aspects of the present inventions, one or more additional solid-state image sensors, and methods of making or using same are discussed herein. Further features of the present inventions will become apparent from the following description of exemplary embodiments with reference to the attached drawings.

DESCRIPTION OF THE EMBODIMENTS

Figure 1:
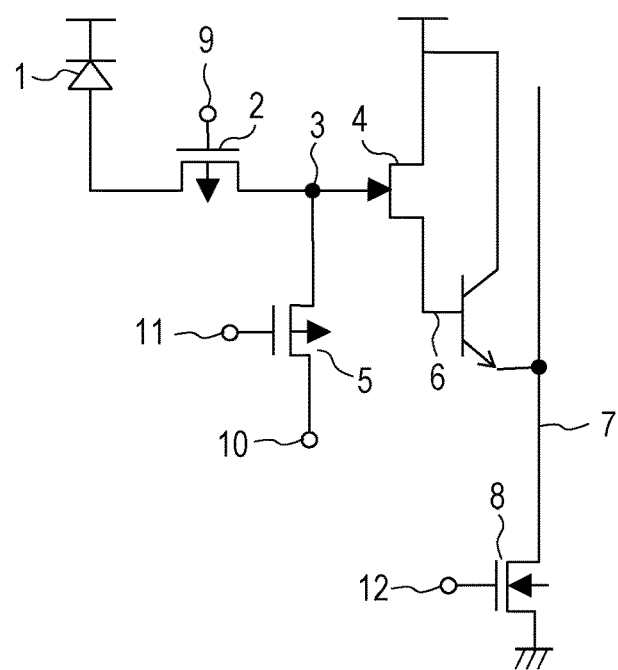
FIG. 1 is a circuit diagram illustrating an example of a configuration of a solid-state image sensor according to a first embodiment.

Embodiments described below disclose techniques of increasing a speed of reading out a signal while achieving a reduction in power consumption, maintaining sensitivity and a saturated amount of charge and/or achieving a reduction in noise.

The solid-state image sensor is mainly classified into two types: a CCD sensor; and a CMOS sensor. In each type, there is a need for increasing the reading speed as well as increasing the number of pixels to satisfy a need for increasing the number of frames of still images capable of being taken per second or for achieving a high-definition movie. In particular, in CMOS sensors, the reading speed can be improved by providing an analog-to-digital conversion (ADC) circuit in each column thereby converting the pixel signal in each column from analog form to digital form. However, a significant improvement has not been achieved in terms of the speed of reading signals from individual pixels, and thus in the CMOS sensor of the column ADC type there is a need for improving the speed of outputting signals from pixels to a pixel output line in each column.

In the CMOS sensor, the time necessary to read out a pixel signal from each pixel via a source follower amplifier is determined by the product of the capacitance of the pixel output line and the reciprocal of the transconductance of an amplifying transistor, that is, the output resistance. This product is equal to a time constant of reading out to the pixel output line. Typically, a practical time necessary to read out a signal is equal to a few times the time constant. Therefore, by reducing the output resistance of the amplifying transistor, it is possible to increase the speed of reading out signals from pixels.

The reduction in the output resistance may be achieved, for example, by increasing the channel width of the amplifying transistor, reducing the channel length of the amplifying transistor, and/or increasing the value of a constant current supplied to each pixel output line, because the output resistance is proportional to the channel width to the power of $-\frac{1}{2}$, the channel length to the power of $\frac{1}{2}$, and the constant current to the power of $-\frac{1}{2}$.

The increasing of the channel width results in an increase in the size of the amplifying transistor, which in turn results in a reduction in the size of the photoelectric conversion unit when the total pixel size is limited. Thus there is a possibility that degradation occurs in a basic performance of the solid-state image sensor such as sensitivity, a saturated amount of signal charge, or the like.

The reduction in the channel length may cause a reduction in an electrical breakdown voltage between the source and the drain. Thus it becomes necessary to reduce the power supply voltage of the pixel part. However, the reduction in the power supply voltage causes a reduction in the saturated amount of signal charge, an increase in random telegraph signal (RTS) noise, and a reduction in signal-to-noise (SN) ratio. On the other hand, the increase in the constant current value causes an undesirable effect that power consumption increases. As described above, in the CMOS sensor, it is difficult to increase the speed of reading out pixel signals without causing a reduction in performance or functionality of the solid-state image sensor.

In view of the above, the embodiments provide a solid-state image sensor capable of operating at a higher speed in reading signals with suppressed power consumption while maintaining a high sensitivity and a high saturated amount of charge and/or reducing noise.

First Embodiment

FIG. 1 is a circuit diagram illustrating an example of a configuration of a solid-state image sensor according to a first embodiment of the inventions. The solid-state image sensor includes a pixel, and a pixel output line 7 via which to read out a pixel signal. A cathode of a photodiode 1 is connected to a power supply potential node. A source of a p-type transfer MOS transistor 2 is connected to an anode of the photodiode 1, a gate thereof is connected to a terminal 9, and a drain thereof is connected to a floating diffusion (FD) region 3. A source of a p-type reset MOS transistor 5 is connected to the floating diffusion region 3, a gate thereof is connected to a terminal 11, and a drain thereof is connected to a reset potential terminal 10. That is, the reset MOS transistor 5 functions as a fourth field effect transistor connected between the gate of the JFET 4 and the reset potential terminal 10, and the n-type junction field effect transistor 4 functions as a first field effect transistor connected such that a drain thereof is connected to the power supply potential node and a gate thereof is connected to the floating diffusion region 3. Hereinafter, the junction field effect transistor is referred to simply as the JFET. The transfer MOS transistor 2 functions as a second field effect transistor connected between the anode of the photodiode 1 and the gate of the JFET 4. A collector of an npn-type bipolar transistor 6 is connected to the drain of the JFET 4, a base thereof is connected to the source of the JFET 4, and an emitter thereof is connected to the pixel output line 7. A drain of an n-type MOS transistor 8 is connected to the pixel output line 7, a gate thereof is connected to a terminal 12, and a source thereof is connected to a ground potential node.

The photodiode 1 functions as a first photoelectric conversion unit that converts incident light into an electric charge (a hole) and accumulates it. The floating diffusion region 3 stores a signal charge. The p-type transfer MOS transistor 2 transfers the signal charge accumulated in the photodiode 1 to the floating diffusion region 3. In this configuration, the signal charge converted by the photoelectric conversion unit is input to the gate of the JFET 4. The p-type reset MOS transistor 5 resets the floating diffusion region 3. The pixel output line 7 is connected to the emitter of the bipolar transistor 6 such that the pixel signal is read out to the pixel output line 7. The n-type MOS transistor 8 is connected to the pixel output line 7 so as to function as a constant current transistor. The terminal 9 is a terminal for applying a pulse to the gate of the transfer MOS transistor 2. The reset potential terminal 10 is connected to the drain of the reset MOS transistor 5. The terminal 11 is a terminal for applying a pulse to the gate of the reset MOS transistor 5. The terminal 12 is a terminal for applying a pulse to the gate of the constant current MOS transistor 8.

The drain of the JFET 4 is connected to the collector of the bipolar transistor 6. A carrier that carries a drain current of the JFET 4 is the same in type as the carrier that carries a collector current of the bipolar transistor 6.

The amplifying transistors are connected such that the source of the JFET 4 is connected to the base of the bipolar transistor 6. The drain current of the JFET 4 and the collector current of the bipolar transistor 6 are both supplied from a substrate. A signal carrier is given at the gate of the JFET 4 and the signal is read out from the emitter of the bipolar transistor 6 configured as emitter follower. More specifically, the source follower of the JFET 4 and the emitter follower of the bipolar transistor 6 are connected in series and a load current is supplied through the pixel output line 7 connected to the emitter of the bipolar transistor 6 thereby forming the amplifier circuit. In this amplifier circuit, a signal hole is given at the gate of the JFET 4 and the signal is output from the emitter of the bipolar transistor 6 to the pixel output line 7. This makes it possible to achieve high-speed reading and low current consumption (lower power consumption). A further detailed description is given below.

Figure 2:
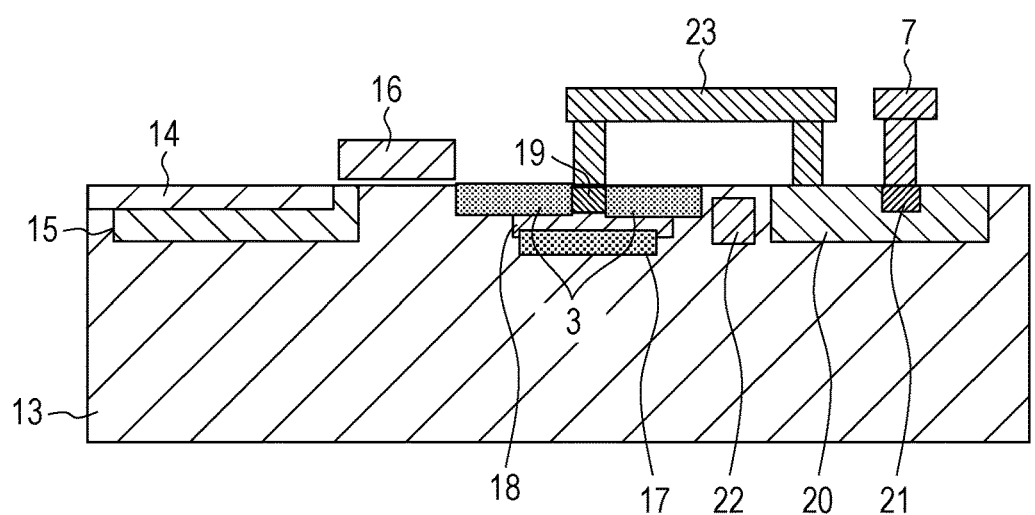
FIG. 2 is a cross-sectional view illustrating an example of a structure of a solid-state image sensor according to the first embodiment.

FIG. 2 is a cross-sectional view illustrating an example of a structure of the solid-state image sensor illustrated in FIG. 1. In FIG. 2, similar parts to those in FIG. 1 are denoted by similar reference numerals. Reference numeral 13 denotes an n-type semiconductor substrate. Reference numeral 14 denotes an n-type diffusion layer 14 formed in a surface part of the semiconductor substrate 13. Reference numeral 15 denotes a p-type diffusion layer for accumulating a signal hole formed below the n-type diffusion layer 14. Reference numeral 16 denotes the gate of the transfer MOS transistor 2. Reference numeral 3 denotes a p-type diffusion layer functioning as both a floating diffusion region and a surface gate of the JFET 4. Reference numeral 17 denotes a p-type diffusion layer functioning as an embedded gate of the JFET 4. Reference numeral 18 denotes an n-type diffusion layer functioning as a channel part of the JFET 4. Reference numeral 19 denotes an n-type diffusion layer functioning as the source of the JFET 4. Reference numeral 20 denotes a p-type diffusion layer functioning as the base of the bipolar transistor 6. Reference numeral 21 denotes an n-type diffusion layer functioning as the emitter of the bipolar transistor 6. Reference numeral 22 denotes an n-type diffusion layer for isolating the JFET 4 from the bipolar transistor 6. Reference numeral 23 denotes a wiring connecting the source 19 of the JFET 4 to the base of the bipolar transistor 6. Reference numeral 7 denotes a pixel output wiring.

The solid-state image sensor illustrated in FIG. 1 and FIG. 2 is configured using, by way of example, the photodiode 1 that accumulates signal holes, the n-type JFET 4 that amplifies the hole signal, and the npn-type bipolar transistor 6. However, the solid-state image sensor is not limited to this configuration. For example, the solid-state image sensor may be configured using a photodiode that accumulates signal electrons, a p-type JFET that amplifies the electron signal, and a pnp-type bipolar transistor.

In general, the output resistance of the emitter follower using the bipolar transistor 6 is smaller than the output resistance of a source follower using a field effect transistor such as a JFET or a MOS transistor. For example, in a case where a transistor used as emitter follower and a transistor used as source follower both have an area of one square micrometer and both have a capacity of providing a constant current of 5 μA, the emitter follower has an output resistance about $1/10$ of the output resistance of the source follower.

When the bipolar transistor 6 operates, a base current flows in. Therefore, if the bipolar transistor 6 receives a signal charge at the base thereof and operates as the emitter follower in a usual manner, the base current causes the signal charge to be destroyed.

In FIG. 1, when a pixel signal charge is read out, the potential of the floating diffusion region 3 is reset by the reset MOS transistor 5 to a potential higher than the potential of floating diffusion regions 3 of other pixels that are not subjected to reading of pixel signals and the pixel signal charge is read out by passing the constant current through the MOS transistor 8. The reading operation is performed twice in total, that is, once before the signal charge is transferred to the floating diffusion region 3 via the transfer MOS transistor 2 and then once again after the transferring of the signal charge is complete, and a pure pixel signal is obtained by determining a difference in signal output to the pixel output line 7 between the first and second reading operations.

The pixel signal outputting operation described above is achieved using the emitter follower operation of the bipolar transistor 6. The base current flowing in the emitter follower operation is supplied by the JFET 4. That is, the base current and the JFET 4 form the source follower, and this source follower is connected in series to the emitter follower. Note that, as a matter of course, the gate and the source of the JFET 4 are set so as to be maintained in a reversely biased state.

When the current gain of the bipolar transistor 6 is hFE, the base current is equal to $1/(hFE+1)$ of the constant current flowing through the MOS transistor 8. Typically hFE has a value in a range from several tens to several hundreds, and thus the base current is small, which causes the source follower formed by the JFET 4 to have a large output resistance. However, the load that is driven by this source follower formed by the JFET 4 is extremely small capacitance formed at the base of the bipolar transistor 6 to which the source follower is connected. Therefore, the speed of reading the pixel signal is not limited by the source follower formed by the JFET 4 unless hFE is extremely large and thus unless the base current is extremely small. The reading speed is actually determined by the emitter follower formed by the bipolar transistor 6 that drives the pixel output line 7 with large capacitance.

In FIG. 1, the constant current flowing through the MOS transistor 8 is set to be, for example, ⅓ of the constant current that is set as a value flowing when the pixel signal is output in the conventional usual CMOS sensor. Even in this setting, the output resistance of the emitter follower formed by the bipolar transistor 6 is as small as ⅓ of the output resistance of the source follower in the pixel of the conventional usual CMOS sensor. That is, compared with the pixel of the conventional usual CMOS sensor, the current consumed in the pixel reading operation in the pixel according to the present embodiment is only ⅓ and the speed of reading the pixel signal is 3 times higher.

Furthermore, the JFET 4 and the bipolar transistor 6 used as the amplifying transistors generally have an advantage that RTS noise is very small compared with that of MOS transistors, which allows it is achieve low noise in the solid-state image sensor. The present embodiment thus makes it possible to achieve a low consumption current, a high reading speed, and low noise in the solid-state image sensor.

Second Embodiment

Figure 3:
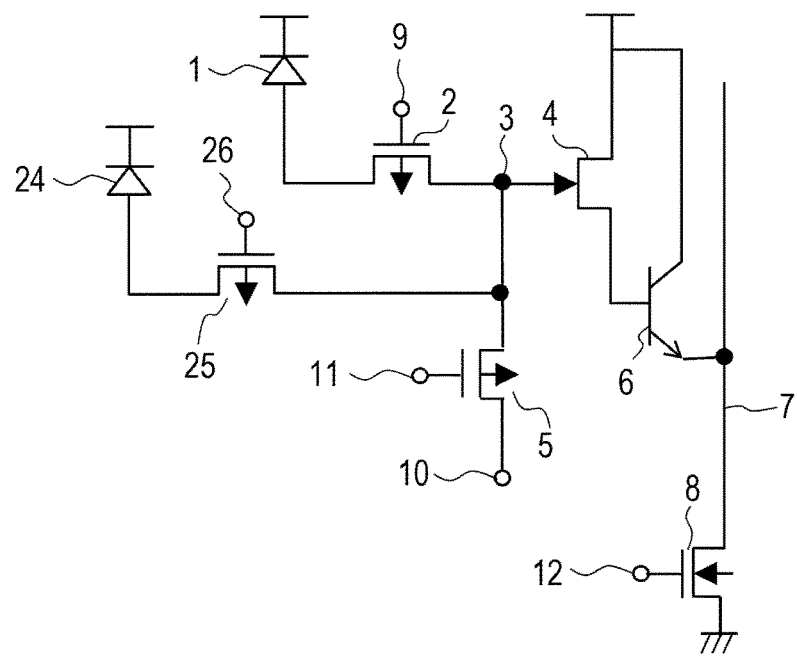
FIG. 3 is a circuit diagram illustrating an example of a configuration of a solid-state image sensor according to a second embodiment.

FIG. 3 is a diagram illustrating an example of a configuration of a solid-state image sensor according to a second embodiment. In this configuration according to the second embodiment illustrated in FIG. 3, a photodiode 24 and a p-type transfer MOS transistor 25 are added to the configuration according to the first embodiment illustrated in FIG. 1. In FIG. 3, elements similar to those in FIG. 1 are denoted by similar reference numerals, and a further detailed description thereof is omitted. The following description focuses on differences of the present embodiment from the first embodiment.

The cathode of the photodiode 24 is connected to the power supply potential node. The p-type transfer MOS transistor 25 is connected such that the source thereof is connected to the anode of the photodiode 24, the gate thereof is connected to the terminal 26, and the drain thereof is connected to the floating diffusion region 3. That is, the transfer MOS transistor 25 functions as the third field effect transistor connected between the anode of the photodiode 24 and the gate of the JFET 4. The photodiode 24 functions as a second photoelectric conversion unit that converts incident light into an electric charge (a hole) and accumulates it. The p-type transfer MOS transistor 25 transfers the signal charge accumulated in the photodiode 24 to the floating diffusion region 3. The terminal 26 is a terminal for applying a pulse to the gate of the transfer MOS transistor 25.

In the second embodiment, the floating diffusion region 3, the reset MOS transistor 5, the JFET 4, and the bipolar transistor 6 are shared by two pixels one of which is a pixel including the photodiode 1 and the transfer MOS transistor 9, and the other one of which is a pixel including the photodiode 24 and the transfer MOS transistor 25.

In the configuration according to the first embodiment described above with reference to FIG. 1, the JFET 4 and the bipolar transistor 6 are exclusively provided for one pixel, and thus the number of elements included in this configuration is greater by one than the number of elements included in the JFET pixel disclosed in Japanese Patent Laid-Open No. 2004-63650. Therefore, when the same pixel size is assumed, it is necessary to reduce the size of the photodiode 1, which results in a reduction in sensitivity and a reduction in saturated amount of signal charge. However, in the pixel configuration illustrated in FIG. 3, the JFET 4 is disposed in one of the two pixels, and the bipolar transistor 6 is disposed in the other one of the two pixels, and thus the configuration according to the present embodiment makes it possible to realize the solid-state image sensor capable of reading signals at a high speed with a low consumption current while maintaining a high sensitivity and a high saturated amount of signal charge.

Third Embodiment

Figure 4:
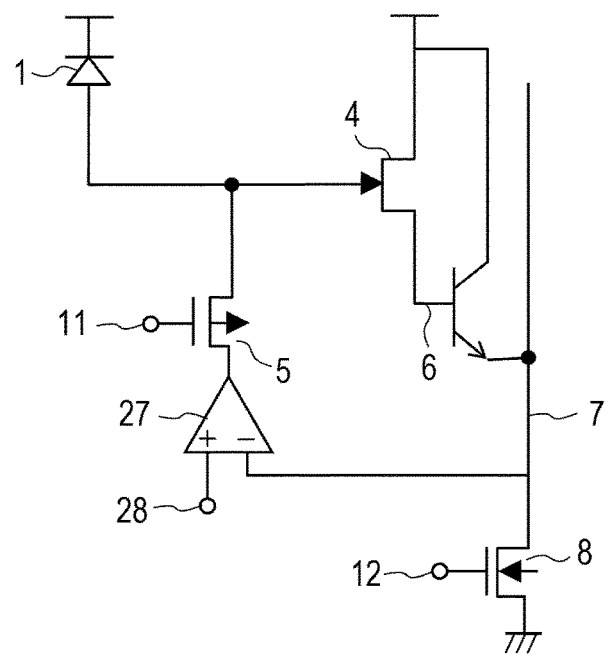
FIG. 4 is a circuit diagram illustrating an example of a configuration of a solid-state image sensor according to a third embodiment.

FIG. 4 is a diagram illustrating an example of a configuration of a solid-state image sensor according to a third embodiment. The configuration according to the third embodiment illustrated in FIG. 4 is different from the configuration according to the first embodiment illustrated in FIG. 1 in that the transfer transistor 2 is removed and an operational amplifier 27 is added. The operational amplifier 27 has two input terminals one of which is connected to the emitter of the bipolar transistor 6 and the other one of which is connected to the reset potential terminal 28. The reset MOS transistor 5 is connected between the gate of the JFET 4 and an output terminal of the operational amplifier 27. Referring to FIG. 4, the present embodiment is described in further detail with focus on differences from the first embodiment illustrated in FIG. 1.

The anode of the photodiode 1 is connected to the gate of the JFET 4 and the source of the reset MOS transistor 5. The non-inverting (+) input terminal of the operational amplifier 27 is connected to the reset potential terminal 28, the inverting (−) input terminal thereof is connected to the pixel output line 7, and the output terminal thereof is connected to the drain of the reset MOS transistor 5. All or at least part of the hole signal accumulation electrode of the anode of the photodiode 1 is formed by the gate itself of the JFET 4. An electric charge (a hole) converted by the photodiode 1 is input to the gate of the JFET 4.

In the pixel, if resetting is performed simply by switching, thermal noise, which is also called kTC noise, occurs. In the CMOS sensor, to remove such noise, a correlated double sampling (hereinafter referred to as CDS) is usually performed to acquire a difference between the signal before the signal charge is transferred and the signal after the signal charge is transferred. However, in the third embodiment, the pixel does not have the transfer MOS transistor 2 (FIG. 1) and thus it is not possible to perform the CDS operation. Instead, feedback resetting is performed to suppress kTC noise. More specifically, in this resetting method, an output of an amplifier circuit having a large negative gain with respect to the potential of the resetting part is fed back to the resetting part thereby suppressing the thermal noise at the resetting part. To accomplish the feedback resetting operation described above, the feedback circuit needs to quickly respond to a change in potential caused by a thermal fluctuation at the resetting part. The larger the response delay, the smaller the thermal noise reduction effect.

In FIG. 4, the resetting part is the gate part of the JFET 4, that is, the signal charge accumulation part. In the resetting operation, the constant current flows through the MOS transistor 8, and a change in potential of the gate of the JFET 4 appears on the pixel output line 7 via the series connection of the source follower and the emitter follower. The potential change on the pixel output line 7 is negatively fed back as the resetting potential to the gate of the JFET 4 via the operational amplifier 27 and the reset MOS transistor 5.

In the feedback resetting, in the case where the amplifier circuit of the pixel is a source follower circuit as with the pixel of the CMOS sensor, it takes a long time for the potential change in the resetting part to appear on the pixel output line 7, which reduces an effect of suppressing the noise. When the feedback resetting is applied to the pixel of the CMOS sensor having no transfer transistor 2 (FIG. 1), the large delay time in outputting the potential change to the pixel output line 7 may cause a significant problem. In this regard, in the configuration according to the third embodiment illustrated in FIG. 4, the change in potential on the resetting part, that is, the gate of the JFET 4 quickly appears on the pixel output line 7, which allows the feedback circuit to quickly respond, which ensures a reduction in kTC noise.

In the configuration according to the third embodiment, the non-existence of the transfer MOS transistor 2 (FIG. 1) allows it to increase the size of the photodiode 1. Besides there is no effect of signal charge transfer efficiency and thus it is possible to achieve a high sensitivity and a high saturated amount of signal charge.

According to the third embodiment, as described above, it is possible to realize the solid-state image sensor having a high noise reduction efficiency which allows it to achieve low noise, and furthermore having a high sensitivity and high saturated amount of signal charge.

Note that in the third embodiment, the photodiode 1 in FIG. 4 may be replaced by a photoelectric conversion film. The photoelectric conversion film is generally disposed on the normal sensor and connected to a semiconductor, and more specifically to the gate of the JFET 4 in the present example, via a wiring.

In the first, second, and third embodiments, alternatively, for example, the signal carrier may be a hole and the transistor type may be opposite for all transistors. In a case where the photodiode 1 converts light into holes, the JFET 4 is an n-type field effect transistor and the bipolar transistor 6 is an npn-type bipolar transistor. On the other hand, in a case where the photodiode 1 converts light into electrons, the JFET 4 is a p-type field effect transistor and the bipolar transistor 6 is a pnp-type bipolar transistor.

Note that it is practically difficult to employ a combination of a signal charge type and a transistor type other than the combinations described above without significant degradation in basic sensor performance. For example, it is very difficult to use electrons as the signal charge and use the n-type JFET as the JFET 4. To employ electrons as the signal charge, it is necessary to form the pixel in a p-type well. However, in this case, it is difficult to isolate the p-type gate of the JFET 4 from the p-type well. In particular, it is very difficult to achieve such a structure in a pixel with a size of about 10 microns or less in diameter.

It is also very difficult to employ a combination of an n-type JFET and a pnp-type bipolar transistor or a combination of a p-type JFET and an npn-type bipolar transistor. In these combinations, there is a difference in type between the control electrode of the JFET and the control electrode of the bipolar transistor, that is, the gate and the base are different in type, and it is difficult to construct them in an isolated form. Furthermore, the current flowing through the source follower and the current flowing through the emitter follower are opposite in direction to each other, and thus it is necessary to form, in the pixel, an additional current source for supplying the current to the source follower. This pixel structure results in a great reduction in the size of the photodiode 1, which causes the resultant solid-state image sensor to have significant degradation in basic performance.

Besides, it is also very difficult to use a MOS transistor instead of the JFET. When an n-type MOS transistor is employed, it is necessary to form it in a p-type well, which makes it difficult to isolate it from an npn-type bipolar transistor without occupying an extra large area.

In the case of the combination of the p-type MOS transistor and the npn-type bipolar transistor, it is rather easy to form them in respective n-type wells. However, the drain current and the collector current are opposite in the flowing direction, and thus it is necessary to form, in the pixel, an additional current source for supplying the current to the source follower.

As described above, if a combination in terms of the carrier types and the transistor types is employed other than those employed in the first to third embodiments, the resultant solid-state image sensor has degradation in basic performance. Thus it may be desirable to employ one of the combinations in terms of the signal carrier types and the transistor types used in the first to third embodiments or one of the combinations of opposite carrier types and opposite transistor types for all carries and transistors thereby achieving the solid-state image sensor having advantages that it is capable of reading out pixel signals at a high speed with low noise and with a low consumption current while increasing the basis performance or at least substantially without having degradation of the basis performing of the sensor.

While the present inventions have been described with reference to exemplary embodiments, it is to be understood that the inventions are not limited to the disclosed exemplary embodiments. The scope of the following claims is to be accorded the broadest interpretation so as to encompass all such modifications and equivalent structures and functions.

This application claims the benefit of Japanese Patent Application No. 2014-124463, filed Jun. 17, 2014, which is hereby incorporated by reference herein in its entirety.

What is claimed is:

1. A solid-state image sensor comprising:
   a first photoelectric conversion unit configured to convert light into an electric charge;
   a first field effect transistor including a gate to which the electric charge converted by the first photoelectric conversion unit is input;
   a bipolar transistor including a base and an emitter, the base being connected to a source of the first field effect transistor, and the emitter being configured to output a signal;
   a second field effect transistor connected between the first photoelectric conversion unit and the gate of the first field effect transistor;
   a second photoelectric conversion unit configured to convert light into an electric charge; and
   a third field effect transistor connected between the second photoelectric conversion unit and the gate of the first field effect transistor.

2. The solid-state image sensor according to claim 1, wherein the first field effect transistor is a junction field effect transistor.

3. The solid-state image sensor according to claim 1, wherein a drain of the first field effect transistor is connected to a collector of the bipolar transistor.

4. The solid-state image sensor according to claim 1, wherein
   the first photoelectric conversion unit converts light into a hole, the first field effect transistor is an n-type field effect transistor, and
the bipolar transistor is an npn-type bipolar transistor.

5. The solid-state image sensor according to claim 1, wherein
the first photoelectric conversion unit converts light into an electron,
the first field effect transistor is a p-type field effect transistor, and
the bipolar transistor is a pnp-type bipolar transistor.

6. The solid-state image sensor according to claim 1, further comprising a reset transistor connected between the gate of the first field effect transistor and a reset potential terminal.

7. The solid-state image sensor according to claim 1, further comprising:
an operational amplifier including two input terminals, one of the two input terminals being connected to the emitter of the bipolar transistor and the other one of the two input terminals being connected to a reset potential terminal; and
a reset transistor connected between the gate of the first field effect transistor and an output terminal of the operational amplifier.

8. The solid-state image sensor according to claim 1, further comprising a plurality of pixels each of which includes the first field effect transistor and the bipolar transistor.

9. A solid-state image sensor comprising:
a first photoelectric conversion unit configured to convert light into an electric charge;
a first field effect transistor including a gate to which the electric charge converted by the first photoelectric conversion unit is input; and
a bipolar transistor including a base and an emitter, the base being connected to a source of the first field effect transistor, and the emitter being configured to output a signal,
wherein
the first photoelectric conversion unit converts light into an electron,
the first field effect transistor is a p-type field effect transistor, and
the bipolar transistor is a pnp-type bipolar transistor.

10. The solid-state image sensor according to claim 9, wherein the first field effect transistor is a junction field effect transistor.

11. The solid-state image sensor according to claim 9, wherein a drain of the first field effect transistor is connected to a collector of the bipolar transistor.

12. The solid-state image sensor according to claim 9, further comprising a second field effect transistor connected between the first photoelectric conversion unit and the gate of the first field effect transistor.

13. The solid-state image sensor according to claim 12, further comprising:
a second photoelectric conversion unit configured to convert light into an electric charge; and
a third field effect transistor connected between the second photoelectric conversion unit and the gate of the first field effect transistor.

14. The solid-state image sensor according to claim 9, further comprising a reset transistor connected between the gate of the first field effect transistor and a reset potential terminal.

15. The solid-state image sensor according to claim 9, further comprising:
an operational amplifier including two input terminals, one of the two input terminals being connected to the emitter of the bipolar transistor and the other one of the two input terminals being connected to a reset potential terminal; and
a reset transistor connected between the gate of the first field effect transistor and an output terminal of the operational amplifier.

16. The solid-state image sensor according to claim 9, further comprising a plurality of pixels each of which includes the first field effect transistor and the bipolar transistor.

17. A solid-state image sensor comprising:
a first photoelectric conversion unit configured to convert light into an electric charge;
a first field effect transistor including a gate to which the electric charge converted by the first photoelectric conversion unit is input;
a bipolar transistor including a base and an emitter, the base being connected to a source of the first field effect transistor, and the emitter being configured to output a signal;
an operational amplifier including two input terminals, one of the two input terminals being connected to the emitter of the bipolar transistor and the other one of the two input terminals being connected to a reset potential terminal; and
a reset transistor connected between the gate of the first field effect transistor and an output terminal of the operational amplifier.

* * * * *